United States Patent
Ransijn et al.

[11] Patent Number: 6,021,143
[45] Date of Patent: Feb. 1, 2000

[54] DYNAMIC CONTROL FOR LASER DIODE DRIVERS

[75] Inventors: Johannes Gerardus Ransijn, Wyomissing Hills; Gregory C. Salvador, Wernersville; James Daniel Yoder, Manheim Township, Lancaster County, all of Pa.

[73] Assignee: Lucent Technologies, Inc., Murray Hill, N.J.

[21] Appl. No.: 09/064,121

[22] Filed: Apr. 21, 1998

[51] Int. Cl.[7] ...................................................... H01S 3/00
[52] U.S. Cl. .................................................. 372/38; 372/29
[58] Field of Search ................................ 372/38, 29, 34

[56] References Cited

U.S. PATENT DOCUMENTS

| | | | |
|---|---|---|---|
| 5,297,157 | 3/1994 | Kaiser et al. | 372/38 |
| 5,349,595 | 9/1994 | Ogawa et al. | 372/38 |
| 5,675,599 | 10/1997 | Abe et al. | 372/38 |
| 5,732,096 | 3/1998 | Suzuki et al. | 372/38 |
| 5,761,230 | 6/1998 | Oono et al. | 372/34 |
| 5,793,786 | 8/1998 | Furumiya | 372/38 |
| 5,883,910 | 3/1999 | Link | 372/38 |

OTHER PUBLICATIONS

Seda et al; Microelectronic Circuits,Chapter 9,pp. 485–487;Holt,Rinehart and Winston;1987.

*Primary Examiner*—Leon Scott, Jr.

[57] ABSTRACT

A dynamic laser diode drive circuit is formed so that the gain of the final gain stage is controlled in association with the level of the drive current supplied to the laser diode. In particular, the current sources associated with the final gain stage and the output stage and commonly controlled so that the gain tracks the current level. That is, in situations required a relatively low current, the gain is minimized to prevent overdriving the output stage (a situation common in prior art arrangements). When a larger laser drive current is required, the gain of the final stage is adjusted to increase the output from this stage and provide a sufficient voltage differential to drive the output stage.

3 Claims, 3 Drawing Sheets

NO OVERSHOOT CONTROL $V_{DIFF}$ IS FIXED

DYNAMIC CONTROL FOR LASER DIODE DRIVERS

BACKGROUND OF THE INVENTION

1. Technical Field

The present invention relates to a driver circuit for laser diodes and, more particularly, to a dynamically controlled driver circuit that is capable of reducing overshoot of the driver circuit.

2. Description of the Prior Art

Laser diode driver circuits generally comprise a number of cascaded gain stages comprising differential pairs of GaAs FETs. A final differential output stage is then used to drive the laser diode with an input current signal, $I_{laser}$. Conventional driver circuits, as discussed in detail below, are static in their design and generally designed to provide large current values for $I_{laser}$, generally in the range of 80–90 mA. However, there are some laser diodes that require drive currents in the range of only 10–20 mA, where these conventional drive circuits result in "overdriving" the laser diode. This results in overshoot on the output signal when data is switching from one logic level to the other and results in chirp of the laser diode output.

Additionally, laser diodes may require different drive currents, as a function of age, to provide the same output signal. That is, laser diodes may require a relatively low drive current (10–20 mA) early in life, then rise to levels of 80–90 mA at end of life. Using a conventional drive circuit with such lasers results in either "over-driving" the laser early in life or "under-driving" the laser later in life. In general, the use of a "static" drive circuit design as is common in the prior art is not suitable for use with laser diodes that have characteristics that change as a function of age.

Lastly, there are various laser diode environments that may result in modifying the drive circuit requirements. For example "uncooled" lasers need to control their drive current to remain at minimal levels, while "cooled" lasers may be able to withstand relatively large drive currents. The same conventional drive circuit is not suitable for use in both applications, requiring that different drive circuits be developed for each situation.

Thus, a need remains in the prior art for a laser diode drive current design that is more robust and capable of use with various laser drive currents.

SUMMARY OF THE INVENTION

The need remaining the prior art is addressed by the present invention, which relates to a driver circuit for laser diodes and, more particularly, to a dynamically controlled driver circuit that is capable of reducing overshoot of the laser output signal.

In a preferred embodiment of the present invention, a common bias signal is used to control the gain of both the gain stage and the output stage of the drive circuit. The gain of the final gate stage is therefore variable and will track the gain of the output stage. Thus, in situations utilizing a relatively low drive current, the gain of the final gain stage will be reduced and prevent overdriving the output stage. As the laser diode drive current is increased, the gain of the final gain stage is likewise increased.

It is an advantage of the drive circuit of the present invention that the same drive circuit can be used for a variety of different situations; for example, with either a "cooled" laser or an "uncooled" laser, where the gain adjustment is used to maintain the proper drive current level. Further, the gain of the final gain stage may be adjusted to compensate for changes in laser operating conditions as a function of time.

Other and further advantages of the present invention will become apparent during the course of the following discussion and by reference to the associated drawings.

BRIEF DESCRIPTION OF THE DRAWINGS

Referring now to the drawings, where like numerals represent like parts in several views.

DETAILED DESCRIPTION

Figure 1:
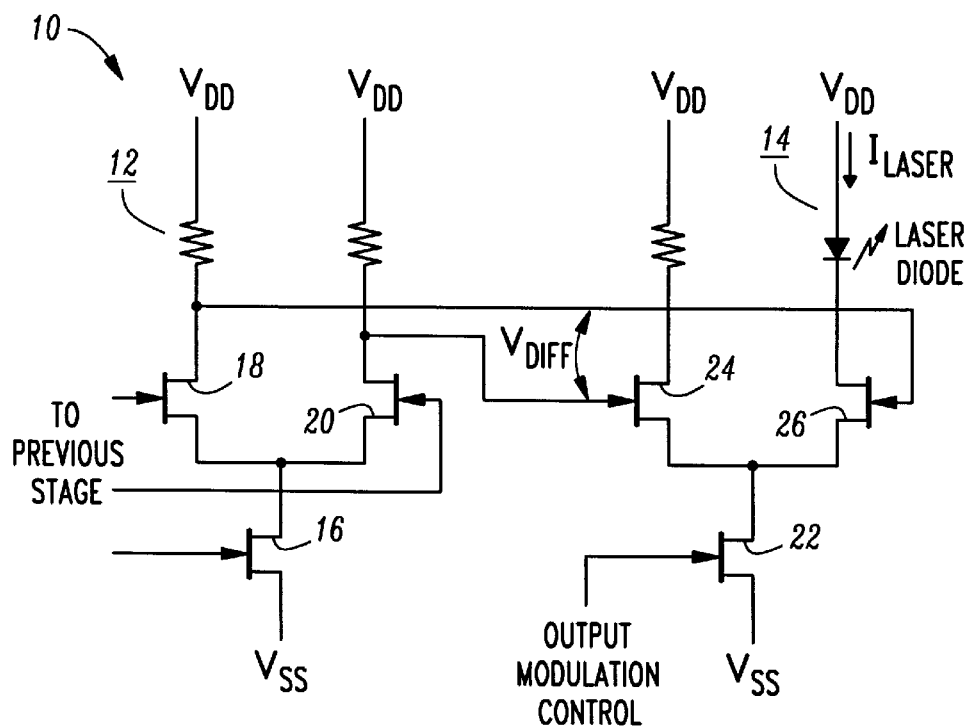
FIG. 1 illustrates a conventional prior art drive circuit.

Laser diode drivers generally consist of a number of cascaded differential gain stages and a final, differential output stage. FIG. 1 illustrates a conventional prior art laser diode driver 10 comprising a differential gain stage 12 and a differential output stage 14 (additional gain stages may be used). The current in gain stage 12 is controlled by transistor 16, which functions as a current source. The gates of transistors 18 and 20 forming gain stage 12 are biased such that transistors 18, 20 are operating at peak transconductance. Output stage 14 utilizes transistor 22 as its current source, where transistor 22 is adjusted to control the desired output laser current, $I_{laser}$.

Figure 2:
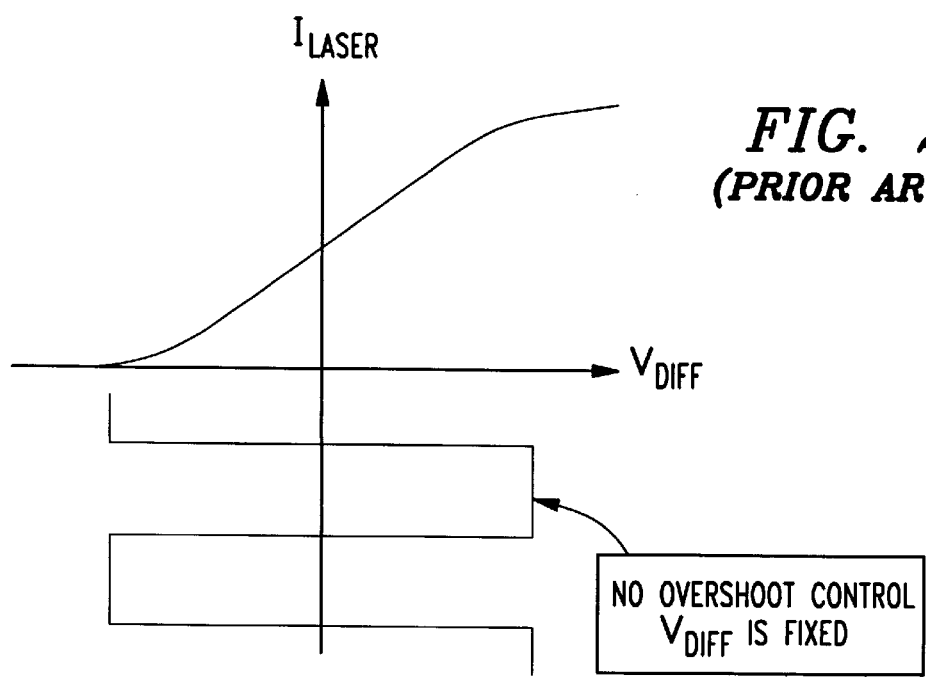
FIG. 2 is a plot of the transfer function of $V_{diff}$ vs. $I_{laser}$ for the prior art circuit of FIG. 1.
Figure 3:
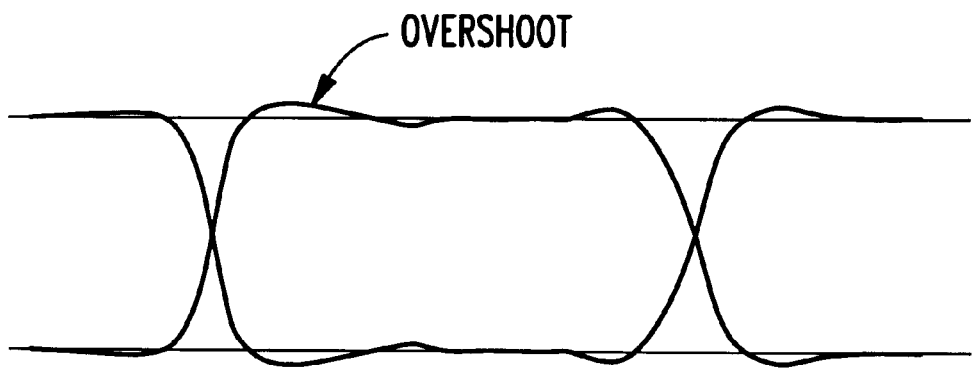
FIG. 3 contains an eye diagram of the output from the drive circuit of FIG. 1, showing in particular the overshoot problem present in the prior art.

FIG. 2 contains a graph of the transfer function associated with prior art driver 10. As shown, over the range of laser currents $I_{laser}$ (as controlled by the current level provided by transistor 22), the differential voltage output, $V_{diff}$, remains fixed. This voltage is fixed, as mentioned above, since the current supplied by transistor 16 remains constant. Conventional driver 10 can thus be defined as a "static" driver circuit. Problems arise with this circuit when a laser diode 23 coupled to output stage 14 requires a relatively low drive current (for example, in the range of 10–20 mA). That is, the large value of $V_{diff}$ supplied as the input to transistors 24 and 26 of output stage 14 will overdrive these devices in the presence of the small current level supplied by transistor 22. As a result, the laser output will overshoot, as shown by the eye diagram contained in FIG. 3.

Figure 4:
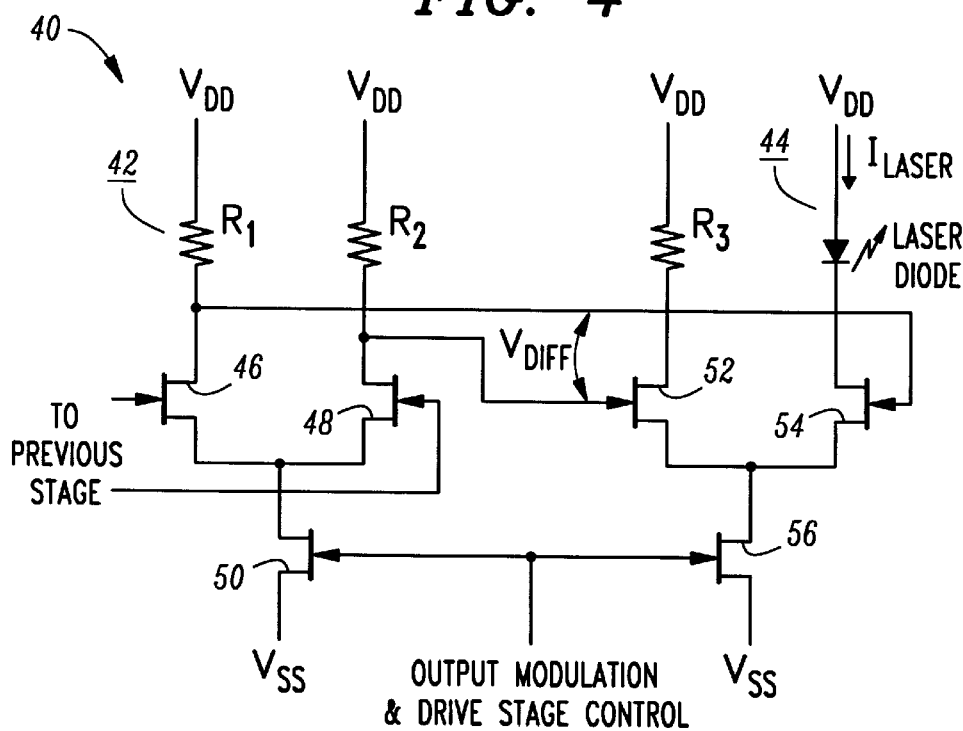
FIG. 4 illustrates a drive circuit formed in accordance with the present invention.

This overshoot problem has been addressed in the circuit arrangement of the present invention where the final gain stage is controlled in tandem with the output stage. Therefore, the gain of the final gain stage will be adjusted as a function of the desired drive current supplied to the laser diode. An exemplary drive circuit 40 of the present invention is illustrated in FIG. 4. Circuit 40 comprises a differential gain stage 42 and a differential output stage 44 (additional gain stages may be included and disposed prior to gain stage 42). Gain stage 42 includes a pair of devices 46, 48 driven by the output of a previous stage (not shown). A transistor 50, coupled to the sources of transistors 46 and 48 is used as the current source for gain stage 42. Output stage 44 comprises a pair of transistors 52 and 54 that are driven by the differential voltage $V_{diff}$ generated by gain stage 42. A transistors 56 is coupled to the sources of transistors 52, 54 and is used as the current source for output stage 44. In a departure from the prior art, the gates of current source transistors 50 and 56 are coupled together and commonly controlled. Therefore, the current supplied to gain stage 42 will be scaled to and, therefore, track the current supplied to output stage 44. As a result, drive circuit 40 is "dynamic" in that the gain of stage 42 may be adjusted as a function of time to change the differential voltage provided as the input the output stage. The ability to adjust $V_{diff}$ thus prevents output stage 44 from being overdriven and prevents the laser output from overshooting.

Figure 6:
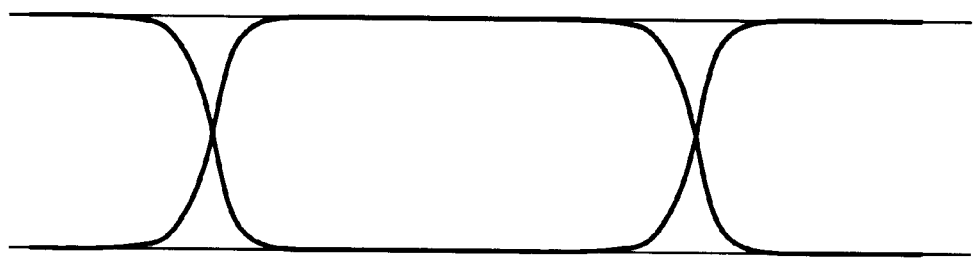
FIG. 6 contains an eye diagram of the output from the inventive drive circuit of FIG. 4.
Figure 5:
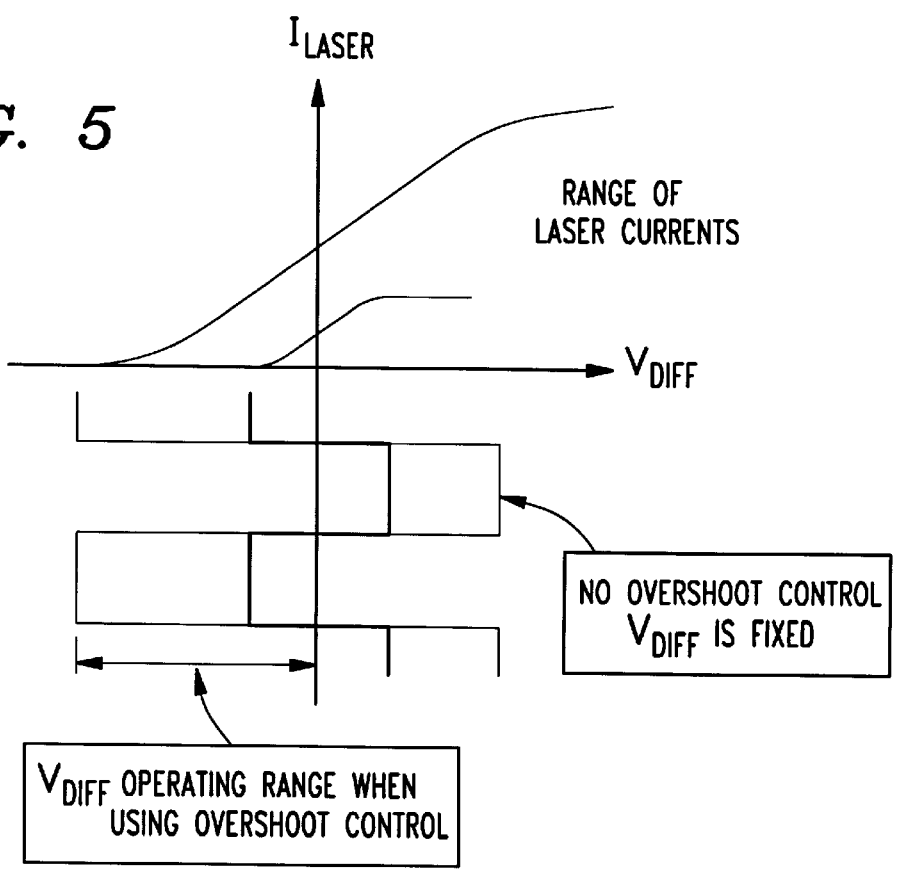
FIG. 5 is a plot of the transfer function of $V_{diff}$ vs. $I_{laser}$ for the circuit of FIG. 4, comparing this transfer function to the prior art transfer function of FIG. 2.

FIG. 5 contains the transfer function associated with the circuit of the present invention, in comparison to the prior art transfer function. Arrows are included in FIG. 5 to illustrate the range of $V_{diff}$ over which the circuit of the present invention may be adjusted. FIG. 6 is an eye diagram illustrating the laser output associated with the drive circuit of the present invention. By comparing the eye diagram of FIG. 6 to the eye diagram of FIG. 3, it is apparent that the overshoot problem of the prior art has been eliminated by the dynamic control arrangement of the present invention.

What is claimed is:

1. A laser diode driver circuit comprising
a differential gain stage including a current source for setting the gain value of said gain stage; and
a differential output stage including a current source for setting the output current level applied as a drive current input to an associated laser diode, the gain stage current source and the output stage current source being commonly controlled to track the gain value with the output current level.

2. A laser diode driver circuit as defined in claim 1 wherein
the differential gain stage comprises a pair of FET transistors and the current source comprises a separate FET transistor coupled to the sources of said pair of FET transistors; and
the differential output stage comprises a pair of FET transistors and the current source comprises a separate FET transistor coupled to the sources of said pair of output stage FET transistors, the gates of the current source transistors connected together and coupled to a common current source.

3. A laser diode driver circuit comprising a differential gain stage and a differential output stage,
the differential gain stage comprising a pair of transistors disposed in parallel between a voltage source and a current source to generate a pair of output voltages, the difference between said pair of output voltages defined as $V_{diff}$; and
the differential output stage comprising a pair of transistors coupled at their gates to the pair of gain stage output voltages and generating an output current $I_{laser}$ for driving an associated laser diode

CHARACTERIZED IN THAT the laser diode driver circuit further comprises
a first current source transistor coupled to the pair of gain stage transistors; and
a second current source transistor coupled to the pair of output stage transistors wherein the gates of said first and second current source transistors are coupled together and commonly controlled.

* * * * *